US009517868B2

(12) United States Patent
Kuratsu

(10) Patent No.: US 9,517,868 B2
(45) Date of Patent: Dec. 13, 2016

(54) LID OPENING/CLOSING DEVICE

(71) Applicant: MURATA MACHINERY, LTD., Kyoto-shi, Kyoto (JP)

(72) Inventor: Noriyuki Kuratsu, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 14/407,197

(22) PCT Filed: Mar. 26, 2013

(86) PCT No.: PCT/JP2013/058840
§ 371 (c)(1),
(2) Date: Dec. 11, 2014

(87) PCT Pub. No.: WO2013/187104
PCT Pub. Date: Dec. 19, 2013

(65) Prior Publication Data
US 2015/0166227 A1 Jun. 18, 2015

(30) Foreign Application Priority Data

Jun. 14, 2012 (JP) .................................. 2012-134830

(51) Int. Cl.
*B65D 43/22* (2006.01)
*B65D 51/00* (2006.01)
(Continued)

(52) U.S. Cl.
CPC ......... *B65D 51/00* (2013.01); *H01L 21/67359* (2013.01); *H01L 21/67373* (2013.01);
(Continued)

(58) Field of Classification Search
CPC ... B65D 45/16; B65D 51/00; H01L 21/67373; H01L 21/67363
(Continued)

(56) References Cited

U.S. PATENT DOCUMENTS 4,674,939 A 6/1987 Maney et al.
4,746,256 A 5/1988 Boyle et al.
(Continued)

FOREIGN PATENT DOCUMENTS

| JP | 3180600 B2 | 6/2001 |
| JP | 3672929 B2 | 7/2005 |
| WO | 2010/131414 A1 | 11/2010 |

OTHER PUBLICATIONS

Official Communication issued in International Patent Application No. PCT/JP2013/058840, mailed on Jun. 11, 2013.
(Continued)

Primary Examiner — J. Gregory Pickett
Assistant Examiner — Niki Eloshway
(74) Attorney, Agent, or Firm — Keating & Bennett, LLP

(57) ABSTRACT

A lid-opening/closing device includes a device body on which a pod including a container body, a lid portion defining a bottom portion openable and closable relative to the container body, and a locking mechanism performing unlocking and locking of the lid portion with respect to the container body is placed; a plurality of moving units that perform unlocking to cause the locking mechanism to perform unlocking and locking to cause the locking mechanism to perform locking by moving engaging pins configured to engage with the locking mechanism; a linkage unit that causes the moving units to perform unlocking by moving the moving units in conjunction with each other when causing the locking mechanism to perform unlocking, and causes the moving units to perform locking by moving the moving units in conjunction with each other when causing the locking mechanism to perform the locking; and an air cylinder that simultaneously drives the moving units and the linkage unit.

4 Claims, 10 Drawing Sheets

(51) Int. Cl.
*H01L 21/677* (2006.01)
*B65D 45/16* (2006.01)
*H01L 21/673* (2006.01)

(52) U.S. Cl.
CPC .. *H01L 21/67769* (2013.01); *H01L 21/67772* (2013.01); *B65D 2585/86* (2013.01); *H01L 21/67363* (2013.01)

(58) Field of Classification Search
USPC ........................................ 220/326, 262, 264
See application file for complete search history.

(56) References Cited

U.S. PATENT DOCUMENTS

| | | | |
|---|---|---|---|
| 5,727,685 A * | 3/1998 | Laganza et al. | 206/455 |
| 5,743,424 A | 4/1998 | Murata et al. | |
| 5,967,571 A | 10/1999 | Gregerson | |
| 6,419,482 B1 | 7/2002 | Sakata et al. | |
| 6,663,148 B2 * | 12/2003 | Bonora et al. | 292/159 |
| 2003/0132232 A1 * | 7/2003 | Eggum | 220/323 |
| 2003/0140663 A1 * | 7/2003 | Carson | 70/63 |
| 2004/0119592 A1 * | 6/2004 | Hahn et al. | 340/545.6 |
| 2007/0080096 A1 * | 4/2007 | Miyajima et al. | 206/710 |
| 2008/0149653 A1 * | 6/2008 | Wu | 220/786 |
| 2009/0084785 A1 * | 4/2009 | Nakatogawa et al. | 220/212.5 |
| 2011/0079539 A1 * | 4/2011 | Kamada et al. | 206/710 |
| 2012/0042988 A1 * | 2/2012 | Shikata et al. | 141/383 |
| 2015/0170949 A1 * | 6/2015 | Fukaya | 414/411 |

OTHER PUBLICATIONS

English translation of Official Communication issued in corresponding International Application PCT/JP2013/058840, mailed on Dec. 24, 2014.

English Translation of Official Communication issued in corresponding Singapore Patent Application No. 11201408295U, mailed on Jul. 2, 2015.

* cited by examiner

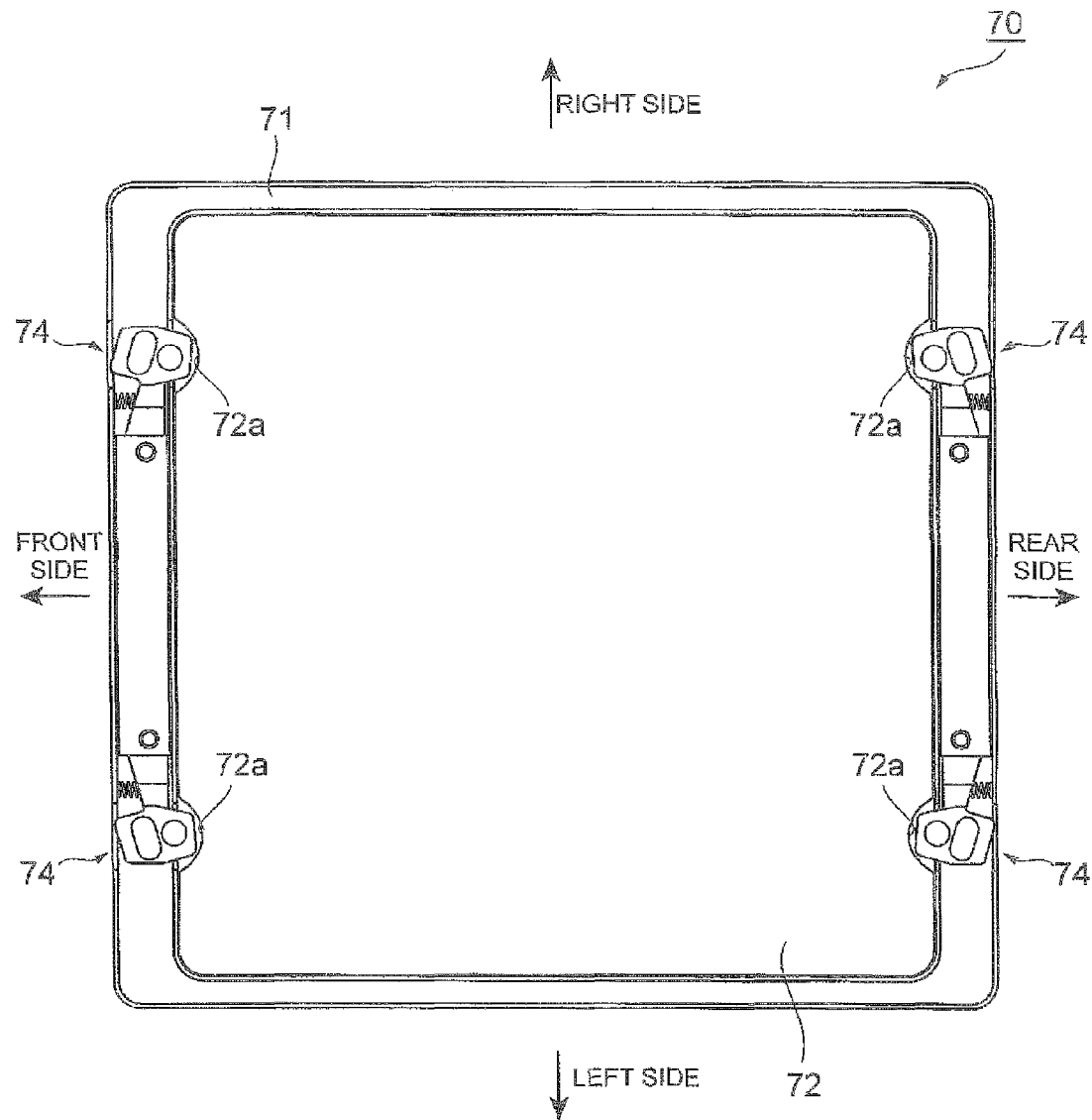

LID OPENING/CLOSING DEVICE

BACKGROUND OF THE INVENTION

1. Field of the Invention

The present invention relates to a lid-opening/closing device that opens and closes a lid portion with respect to a container body in a storage container that stores therein an object to be stored.

2. Description of the Related Art

In a clean room of a factory manufacturing semiconductor devices or liquid crystal displays, for example, semiconductor wafers or glass substrates, for example, are conveyed while being stored in a storage container. Accordingly, when such objects to be stored are transferred between the storage container and each device, a lid portion needs to be opened and closed with respect to a container body by a lid-opening/closing device. To quickly and stably open and close such a lid portion with respect to a container body, various techniques have been proposed (see Japanese Patent No. 3180600, for example) in which, for example, a lid-opening/closing device is provided with a pressure-equalizing mechanism for equalizing pressures between the interior and the exterior of a storage container.

Because such a factory manufacturing semiconductor devices or liquid crystal displays described above urgently needs improvement in the efficiency of conveying various parts, improving the efficiency of transferring objects to be stored between storage containers and various devices is also very important.

SUMMARY OF THE INVENTION

In view of this, preferred embodiments of the present invention provide a lid-opening/closing device that quickly and stably opens and closes a lid portion with respect to a container body with a configuration at a reduced cost.

A preferred embodiment of the present invention provides a lid-opening/closing device for a storage container provided with a container body storing therein an object to be stored, a lid portion defining a bottom portion openable and closable with respect to the container body and on which the object to be stored is placed, and a locking mechanism configured to perform unlocking and locking of the lid portion with respect to the container body, the lid-opening/closing device being configured to open and close the lid portion with respect to the container body and including a device body on which the storage container is placed; a plurality of moving units each including an engaging portion configured to engage with the locking mechanism when the storage container is placed on the device body, and configured to perform an unlocking operation to cause the locking mechanism to perform the unlocking and a locking operation to cause the locking mechanism to perform the locking by moving the engaging portion; a linkage unit configured to cause the moving units to perform the unlocking operation by moving the moving units in conjunction with each other when causing the locking mechanism to perform the unlocking, and to cause the moving units to perform the locking operation by moving the moving units in conjunction with each other when causing the locking mechanism to perform the locking; and an actuator provided for the moving units and the linkage unit and configured to simultaneously drive the moving units and the linkage unit.

In this lid-opening/closing device, when the locking mechanism is caused to unlock the lid portion with respect to the container body in the storage container, the linkage unit causes the moving units to perform the unlocking operation by moving the moving units in conjunction with each other. When the locking mechanism is caused to lock the lid portion with respect to the container body in the storage container, the linkage unit causes the moving units to perform the locking operation by moving the moving units in conjunction with each other. Because the unlocking operation and the locking operation are performed by the moving units simultaneously in this manner, the unlocking operation and the locking operation is quickly and accurately performed without occurrence of variations in the operations. In addition, because one actuator simultaneously drives the moving units and the linkage unit, the cost is significantly reduced. Furthermore, when the mechanism is adjusted, it is only necessary to adjust a spot where the actuator is connected with a part to be driven, and thus the cost is significantly reduced in terms of easy maintenance. In view of this, the lid-opening/closing device enables the lid portion to be quickly and stably opened and closed with respect to the container body with a configuration at a significantly reduced cost.

Each of the moving units may further include a first rotating member that is rotatably supported by the device body and is configured to move the engaging portion, and the linkage unit may include a first connecting member that is configured to connect at least a pair of the first rotating members to rotate the first rotating members. This configuration enables the respective moving units to be surely operated with a simple configuration of a link mechanism including the first rotating members and the connecting members.

The pair of the first rotating members connected by the first connecting member preferably are provided in a plurality of pairs so that the respective pairs are positioned on a first side and on a second side of the lid portion when the storage container is placed on the device body. The linkage unit preferably also includes a pair of second rotating members that are rotatably supported by the device body and to which the respective first connecting members are connected; and a second connecting member configured to connect the pair of the second rotating members so as to rotate the second rotating members. With this configuration, even when the moving units are provided in a plurality of pairs so that the respective pairs are positioned on the first side and the second side of the lid portion, the respective moving units are surely operated.

The device body preferably includes a recessed portion in which the moving units, the linkage unit, and the actuator are provided; and a top panel portion configured to cover the recessed portion and defines a placement surface on which the storage container is placed. The engaging portion preferably is an engaging pin that is installed upright on each of the first rotating members. The top panel portion is preferably provided with an opening that preferably has an elongated hole shape and through which the engaging pin protrudes from the placement surface to be able to move between a position of the unlocking operation and a position of the locking operation. In a linear-motion-type mechanism (such as a rod), because air is pushed away due to volume movement, generated particles easily diffuse. In contrast, in a rotation-type mechanism, because volume movement is generally smaller than that in the linear-motion-type mechanism (theoretically zero in a case of a perfectly circular plate) and a sliding area can be easily identified (e.g., shaft-supporting portion), generated particles are effectively prevented from diffusing. In the above-described configuration, at a position facing each opening of the top panel portion in the recessed portion of the device body, each of the first rotating members being rotation-type mechanisms is positioned, so that the linear-motion-type mechanism is separated from the position. Thus, generated particles are appropriately prevented from going out of the device body through the opening, and the surrounding clean environment is prevented from being contaminated.

The actuator preferably is an air cylinder that includes a cylinder portion attached to the device body and a rod portion a base end of which is inserted into the cylinder portion and a leading end of which is attached to the second connecting member, and the rod portions is slid by charging or discharging gas into or from the cylinder portion. With this configuration, because the actuator imparting a driving force to the moving units and the linkage unit is the air cylinder, compared to the case using a rack-and-pinion mechanism, for example, dust emission is prevented during the operations and also the mechanism is simplified. Thus, the respective moving units are surely operated while the inside of the device and the atmosphere in the vicinity are maintained clean.

Various preferred embodiments of the present invention enable a lid-opening/closing device to be provided that quickly and stably opens and closes a lid portion with respect to a container body with a configuration at a reduced cost.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a bottom view of a pod the lid portion of which is opened and closed by the lid-opening/closing device of FIG. 4.

DETAILED DESCRIPTION OF THE PREFERRED EMBODIMENTS

Figure 1:
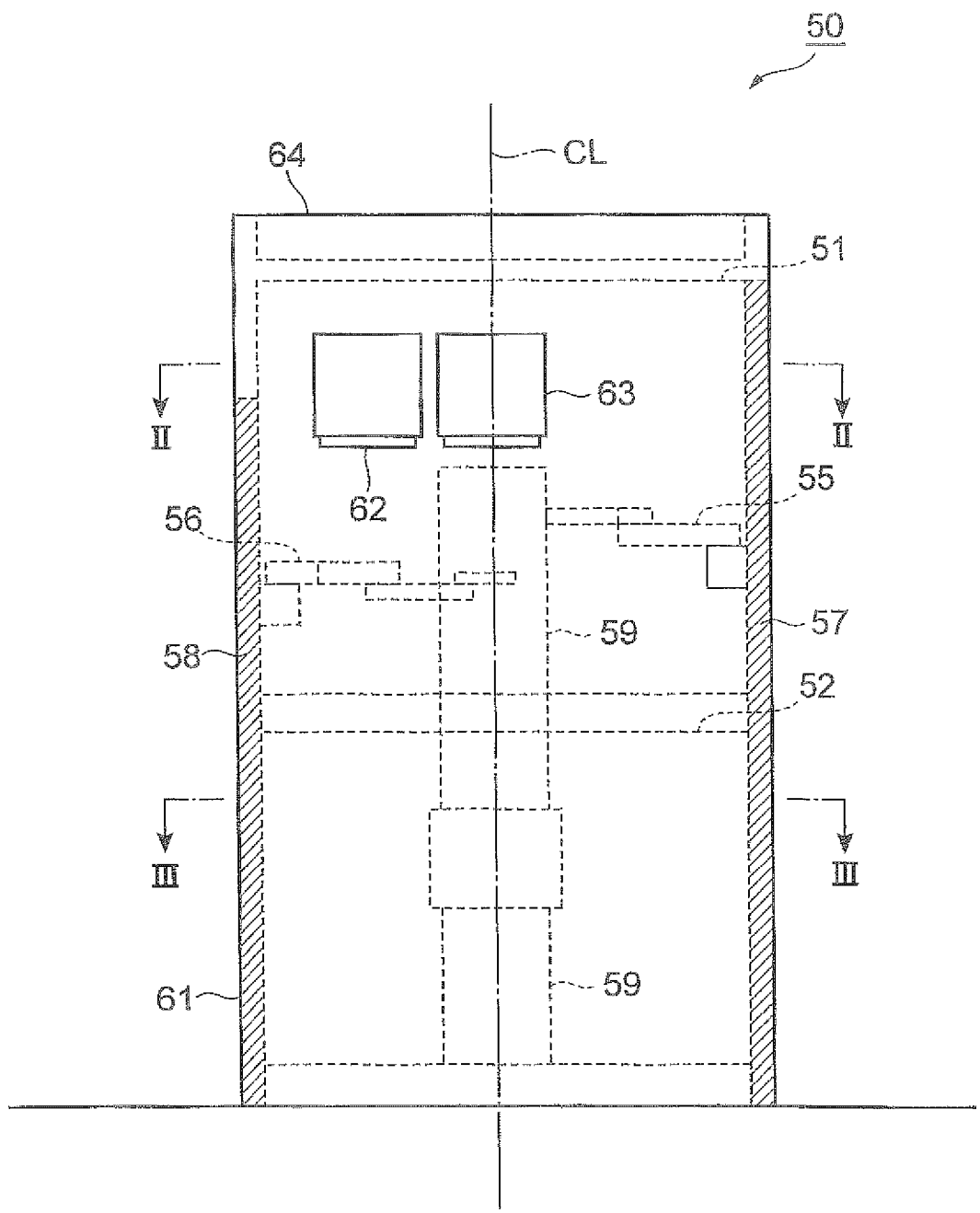
FIG. 1 is a front view of a storage cabinet including a lid-opening/closing device according to a preferred embodiment of the present invention.

Preferred embodiments of the present invention will be described hereinafter in detail with reference to the drawings. In the drawings, like reference signs indicate like or corresponding components, and duplicate description is omitted.

Figure 2:
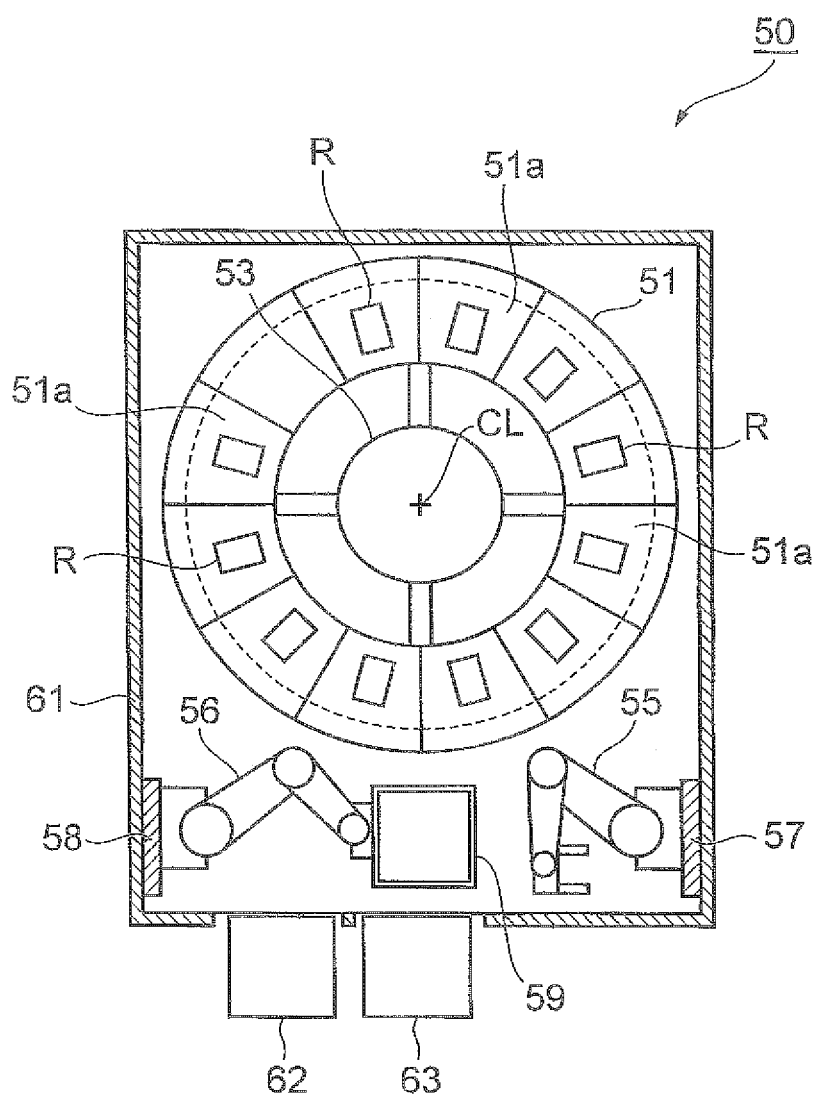
FIG. 2 is a sectional view of the storage cabinet along line II-II of FIG. 1.
Figure 3:
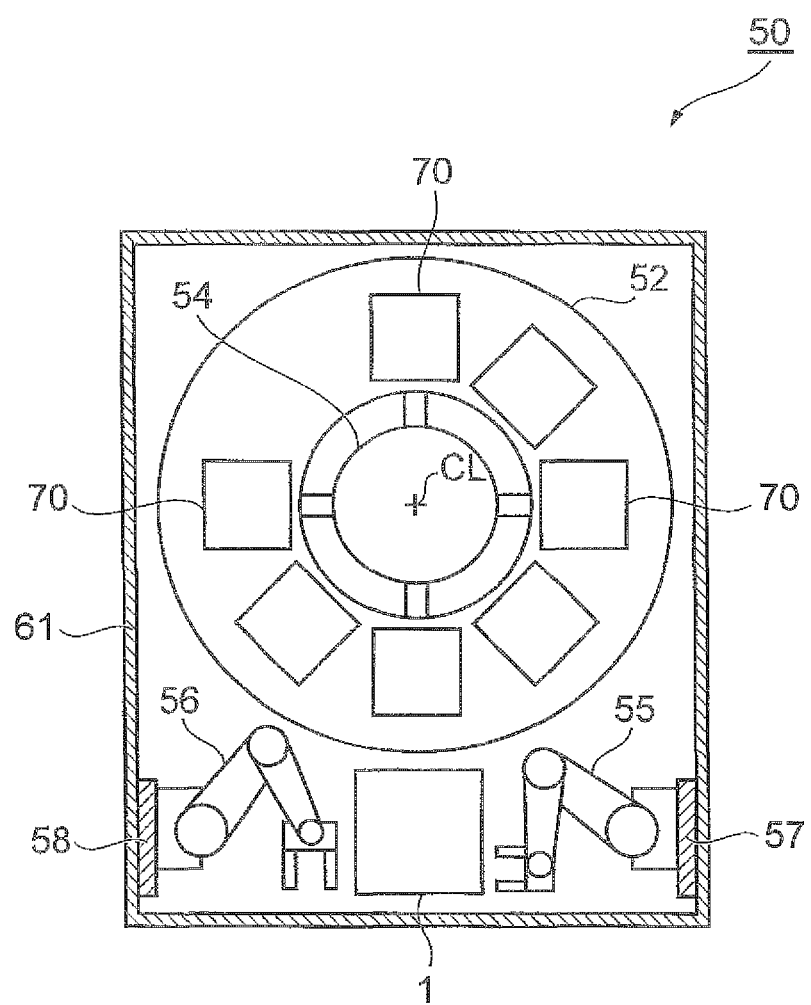
FIG. 3 is a sectional view of the storage cabinet along line III-III of FIG. 1.

FIG. 1 is a front view of a storage cabinet including a lid-opening/closing device according to a preferred embodiment of the present invention. FIG. 2 is a sectional view of the storage cabinet along line II-II of FIG. 1. FIG. 3 is a sectional view of the storage cabinet along line III-III of FIG. 1. As depicted in FIGS. 1 to 3, this storage cabinet 50 includes a reticle-specific rotating rack 51 and a pod-specific rotating rack 52. The reticle-specific rotating rack 51 stores therein a plurality of reticles R each of which preferably has a rectangular or substantially rectangular plate shape and is used when a semiconductor wafer or a glass substrate, for example, is exposed to light to form a predetermined pattern on the surface thereof. The pod-specific rotating rack 52 stores therein a plurality of pods 70 for storing therein and conveying the reticles R in an empty state. The pods 70 configured to store the reticles R each typically have a configuration according to the SEMI standard that is an international standard for semiconductors, for example. These storage cabinets 50 are installed in a clean room of a factory manufacturing semiconductor devices or liquid crystal displays, for example.

The reticle-specific rotating rack 51 is rotated around an axis line CL by a driving unit 53. The reticle-specific rotating rack 51 includes a plurality of blocks 51a that are arranged along the rotating direction. The respective blocks 51a are configured to be able to store the reticles R on a plurality of shelves provided therein one above another. The pod-specific rotating rack 52 is rotated around the axis line CL by the driving unit 54 below the reticle-specific rotating rack 51. The pod-specific rotating rack 52 is configured to be able to store therein the pods 70 along the rotating direction.

The storage cabinet 50 further includes a reticle conveying device 55, a pod conveying device 56, and the lid-opening/closing device 1. The reticle conveying device 55 is a robot arm that ascends and descends along an elevating guide 57, and conveys the reticles R between the lid-opening/closing device 1 and the reticle-specific rotating rack 51. The pod conveying device 56 is a robot arm that ascends and descends along an elevating guide 58, and conveys the pods 70 being empty between the lid-opening/closing device 1 and the pod-specific rotating rack 52. The lid-opening/closing device 1 is a device called a pod opener, and opens and closes the pods 70. Near the lid-opening/closing device 1, a pod-specific stationary rack 59 is installed and configured to temporarily store therein the pods 70 storing therein the reticles R and the pods 70 being empty.

The rotating racks 51 and 52, the driving units 53 and 54, the conveying devices 55 and 56, the stationary rack 59, and the lid-opening/closing device 1 are arranged in a casing 61. The casing 61 is provided with ports 62 and 63 through which an overhead traveling vehicle, for example, has access. The pods 70 storing therein the reticles R are put into the casing 61 through the port 62, and the pods 70 storing therein the reticles R are taken out of the casing 61 through the port 63.

On an upper wall of the casing 61, a clean-gas supplying device 64 is installed. The clean-gas supplying device 64 supplies clean gas such as clean air or nitrogen as a downflow into the casing 61. The clean gas supplied into the casing 61 is discharged out of the casing 61 from a lower portion of the casing 61.

The following describes operation of the storage cabinet 50 when a pod 70 storing therein a reticle R is put in. After the pod 70 is conveyed to the port 62 by an overhead traveling vehicle, for example, the pod 70 is conveyed to the lid-opening/closing device 1 by the pod conveying device 56. After the pod 70 is conveyed to the lid-opening/closing device 1, the reticle R stored in the pod 70 is stored in the reticle-specific rotating rack 51 by the reticle conveying device 55. Then, the empty pod 70 that is left in the lid-opening/closing device 1 is stored in the pod-specific rotating rack 52 by the pod conveying device 56. When a plurality of pods 70 are consecutively put into the casing 61, the pods 70 are temporarily stored in the pod-specific stationary rack 59, and are sequentially conveyed to the lid-opening/closing device 1.

The following describes operation of the storage cabinet 50 when a pod 70 storing therein a reticle R is taken out. After a reticle R is conveyed from the reticle-specific rotating rack 51 to the lid-opening/closing device 1 by the reticle conveying device 55, the reticle R is stored in an empty pod 70 that is conveyed from the pod-specific rotating rack 52 to the lid-opening/closing device 1 by the pod conveying device 56. The pod 70 storing therein the reticle R is conveyed from the lid-opening/closing device 1 to the port 63 by the pod conveying device 56, and is conveyed from the port 63 to a predetermined destination by an overhead traveling vehicle, for example. When a plurality of pods 70 are consecutively taken out of the casing 61, the pods 70 are temporarily stored in the pod-specific stationary rack 59, and are sequentially conveyed to the port 63.

Figure 4:
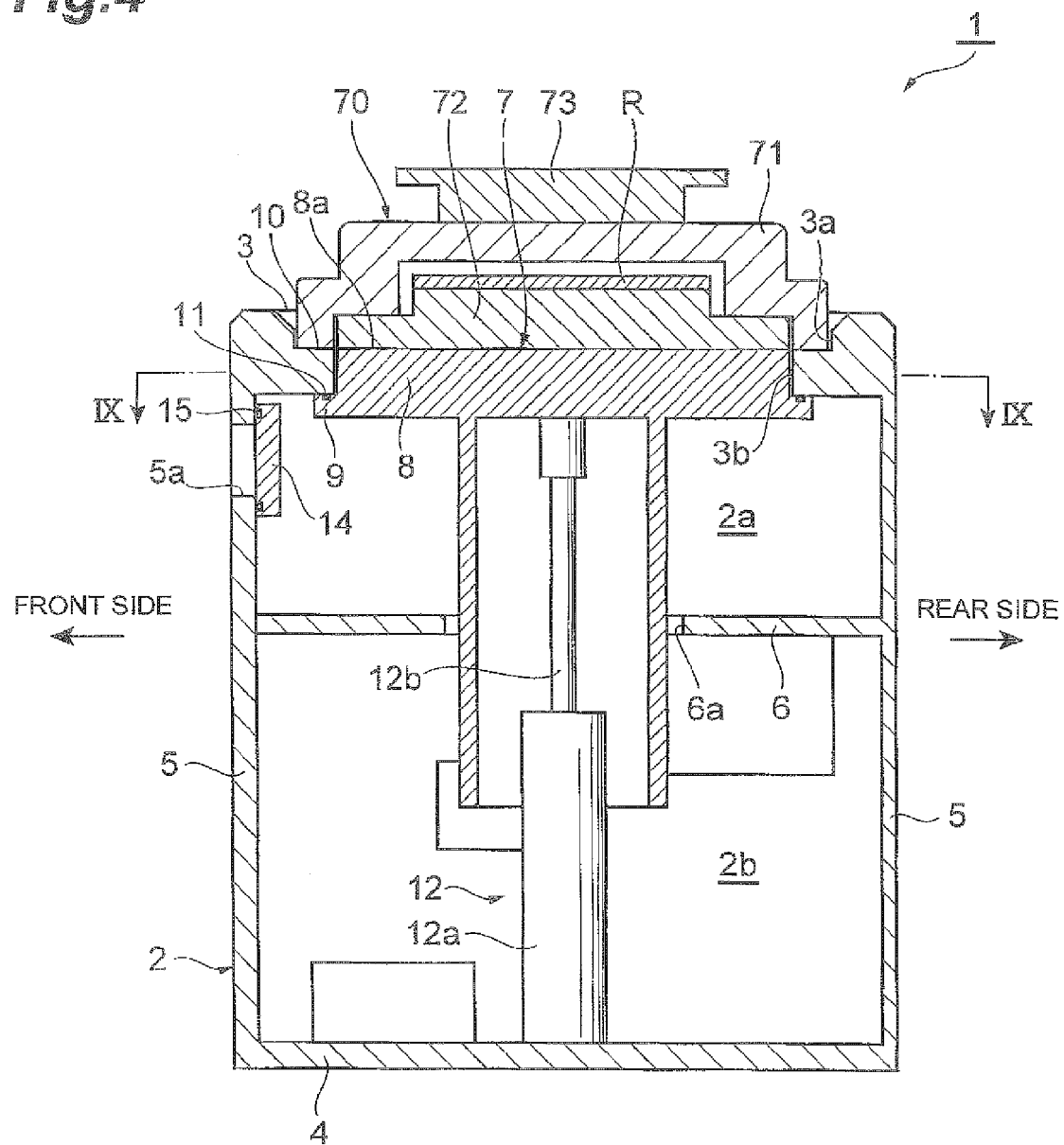
FIG. 4 is a longitudinal sectional view of the lid-opening/closing device according to a preferred embodiment of the present invention.
Figure 5:
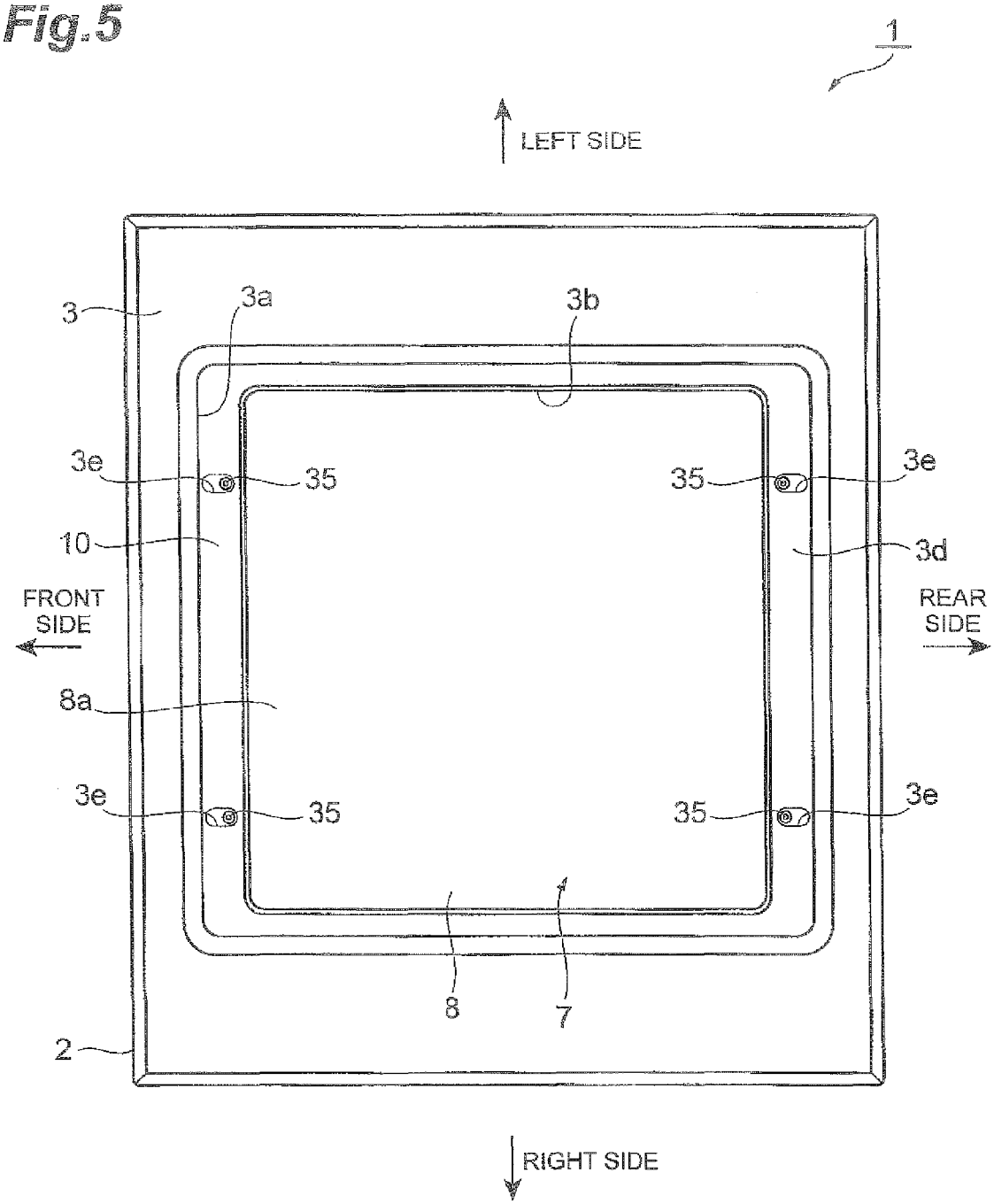
FIG. 5 is a plan view of the lid-opening/closing device of FIG. 4.

FIG. 4 is a longitudinal sectional view of the lid-opening/closing device of a preferred embodiment of the present invention, and FIG. 5 is a plan view of the lid-opening/closing device of FIG. 4. In the following description, the side through which the reticles R are loaded into and unloaded from the lid-opening/closing device 1 is referred to as "front side", and the opposite side is referred to as "rear side". The left side of the lid-opening/closing device 1 in an erect state when seen from the front side is simply referred to as "left side", and the right side of the lid-opening/closing device 1 in the erect state when seen from the front side is simply referred to as "right side".

As depicted in FIGS. 4 and 5, the lid-opening/closing device 1 includes a device body 2 preferably having a shape of a rectangular or substantially rectangular parallelepiped box. The device body 2 preferably includes an upper wall 3, a lower wall 4, side walls 5, and a partition 6. The inner space of the device body 2 is divided by the partition 6 into a reticle load/unload area 2a and an apparatus installation area 2b that are arranged one above the other. However, the reticle load/unload area 2a and the apparatus installation area 2b are communicated with each other in an area on the left side and in an area on the right side of the partition 6. The upper wall 3 is provided with a recessed portion 3a preferably having a rectangular or substantially rectangular cross-section, and the bottom surface of the recessed portion 3a is provided with an opening 3b preferably having a rectangular or substantially rectangular, for example. The bottom surface of the recessed portion 3a defines and serves as a placement surface 10 on which a pod (storage container) 70 conveyed by the pod conveying device 56 is placed. The pod 70 includes a container body 71 that preferably has a rectangular or substantially rectangular parallelepiped box and stores therein a reticle (object to be stored) R and a lid portion 72 that preferably has a rectangular or substantially rectangular plate shape and on which the reticle R is placed, for example. The lid portion 72 defines a bottom portion that is configured to be opened and closed with respect to the container body 71. The top portion of the container body 71 is provided with a held portion 73 that is held by the pod conveying device 56. The lid-opening/closing device 1 is a device that opens and closes the lid portion 72 with respect to the container body 71 for the pod 70 storing therein the reticle R.

In the device body 2, an elevating stage 7 is configured to ascend and descend in the reticle load/unload area 2a. The elevating stage 7 preferably includes a body portion 8 preferably having a rectangular or substantially rectangular plate shape and a flange portion 9 that preferably has a rectangular or substantially rectangular plate shape and is provided to the lower end of the body portion 8. When the elevating stage 7 ascends, the body portion 8 is arranged in the opening 3b, and the flange portion 9 abuts the inner surface of the upper wall 3. At this time, the opening 3b of the upper wall 3 is air-tightly closed with a sealing member 11 that preferably has a rectangular preferably or substantially rectangular ring shape and is provided on the flange portion 9, and the upper surface 8a of the body portion 8 is flush with the placement surface 10 (i.e., the bottom surface of the recessed portion 3a).

In the device body 2, an air cylinder 12 is configured to move the elevating stage 7 up and down. The air cylinder 12 preferably includes a cylinder portion 12a that is fixed on the inner surface of the lower wall 4 and a rod portion 12b the base end of which is inserted into the cylinder portion 12a. The leading end of the rod portion 12b is fixed on the lower surface of the elevating stage 7 through an opening 6a that preferably has a rectangular or substantially rectangular cross-section and is provided at the central portion of the partition 6. In the apparatus installation area 2b in the device body 2, various apparatuses are provided such as an electromagnetic valve configured to control charge and discharge of gas into and from the air cylinder 12. To move up and down the elevating stage 7, a plurality of air cylinders may be used, or another actuator may be used instead of the air cylinder.

The side wall 5 on the front side of the device body 2 is provided with a reticle load/unload port 5a preferably having a rectangular or substantially rectangular cross-section and configured to communicate between the exterior and the reticle load/unload area 2a in the device body 2. The reticle load/unload port 5a is opened and closed from inside by a closing plate 14 that is operated by an actuator such as an air cylinder, for example. When the reticle load/unload port 5a is closed by the closing plate 14, the reticle load/unload port 5a is air-tightly closed with a sealing member 15 that preferably has a rectangular or substantially rectangular ring shape and is provided to the closing plate 14.

The following describes operation of the lid-opening/closing device 1 when a pod 70 storing therein a reticle R is put in. As depicted in FIG. 4, the lid-opening/closing device 1 stands by with the opening 3b of the upper wall 3 air-tightly closed by the elevating stage 7 and with the reticle load/unload port 5a air-tightly closed by the closing plate 14. In this state, after the pod 70 that is conveyed from the port 62 into the lid-opening/closing device 1 by the pod conveying device 56 is placed on the placement surface 10 of the lid-opening/closing device 1, the locking mechanism of the pod 70 is put into the unlock state by the lid-opening/closing device 1 (the detail will be described later).

Figure 6:
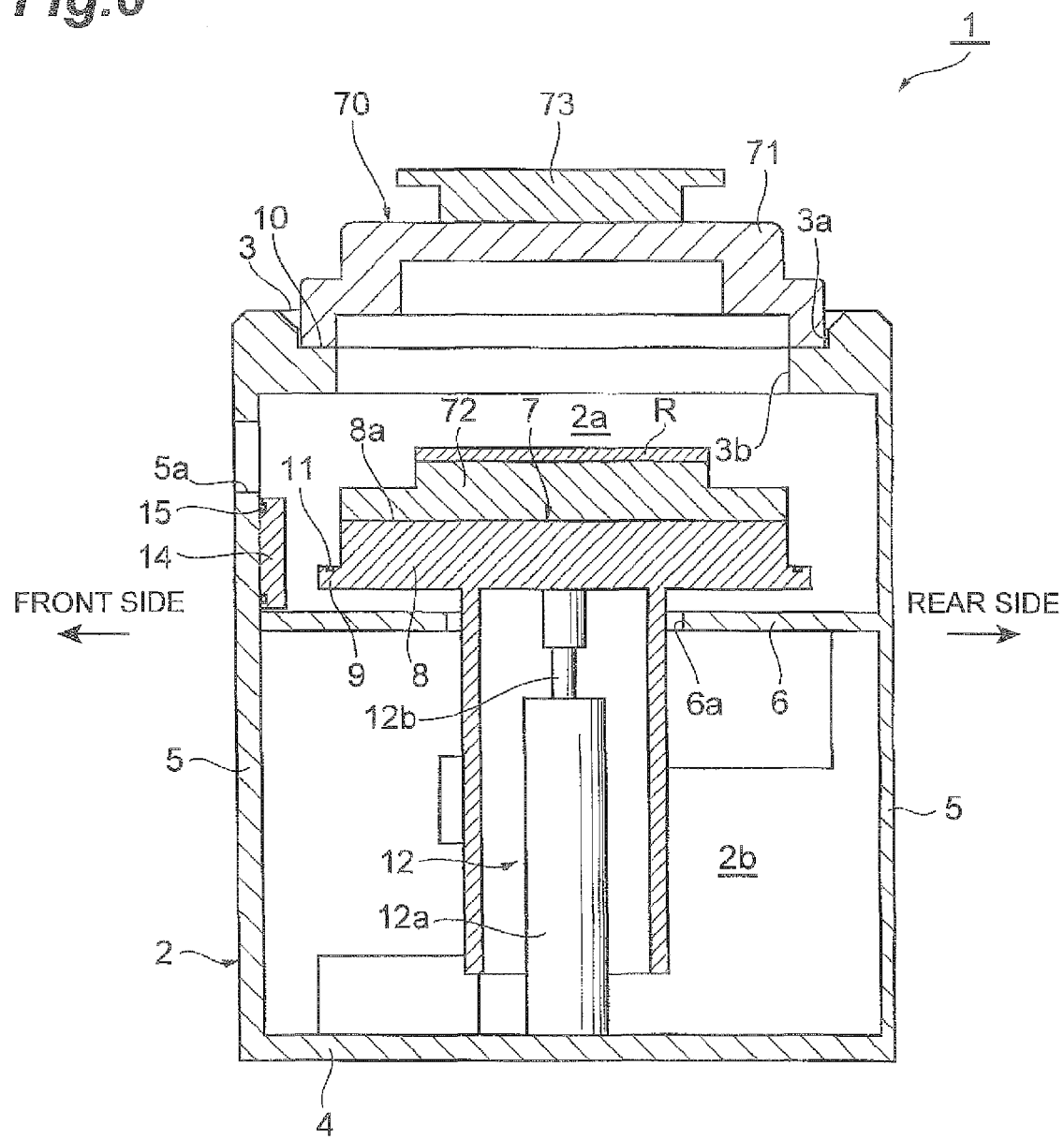
FIG. 6 is a longitudinal sectional view of the lid-opening/closing device of FIG. 4 in another state.

Subsequently, as depicted in FIG. 6, the elevating stage 7 descends together with the lid portion 72 on which the reticle R is placed, and the reticle R is arranged in the reticle load/unload area 2a. After the closing plate 14 operates to open the reticle load/unload port 5a, the reticle conveying device 55 accesses the reticle load/unload area 2a through the reticle load/unload port 5a to store the reticle R arranged in the reticle load/unload area 2a in the reticle-specific rotating rack 51.

Subsequently, the closing plate 14 operates, so that the reticle load/unload port 5a is air-tightly closed by the closing plate 14. In addition, the elevating stage 7 ascends together with the lid portion 72, so that the opening 3b of the upper wall 3 is air-tightly closed by the elevating stage 7. Then, the locking mechanism of the empty pod 70 placed on the placement surface 10 of the lid-opening/closing device 1 is put into a locked state by the lid-opening/closing device 1 (the detail will be described later). The empty pod 70, the locking mechanism of which is in the locked state, is stored in the pod-specific rotating rack 52 by the pod conveying device 56.

The following describes operation of the storage cabinet 50 when a pod 70 storing therein a reticle R is taken out. As depicted in FIG. 4, the lid-opening/closing device 1 stands by with the opening 3b of the upper wall 3 air-tightly closed by the elevating stage 7 and with the reticle load/unload port 5a air-tightly closed by the closing plate 14. In this state, after an empty pod 70 that is conveyed from the pod-specific rotating rack 52 to the lid-opening/closing device 1 by the pod conveying device 56 is placed on the placement surface 10 of the lid-opening/closing device 1, the locking mechanism of this pod is put into the unlocked state by the lid-opening/closing device 1 (the detail will be described later).

Subsequently, as depicted in FIG. 6, the elevating stage 7 descends together with the lid portion 72, and the lid portion 72 is arranged in the reticle load/unload area 2a. After the closing plate 14 operates to open the reticle load/unload port 5a, the reticle conveying device 55 that has conveyed the reticle R from the reticle-specific rotating rack 51 accesses the reticle load/unload area 2a through the reticle load/unload port 5a to place the reticle R on the lid portion 72 arranged in the reticle load/unload area 2a.

Subsequently, the closing plate 14 operates, so that the reticle load/unload port 5a is air-tightly closed by the closing plate 14. In addition, the elevating stage 7 ascends together with the lid portion 72 on which the reticle R is placed, so that the opening 3b of the upper wall 3 is air-tightly closed by the elevating stage 7. Then, the locking mechanism of the pod 70 placed on the placement surface 10 of the lid-opening/closing device 1 is put into the locked state by the lid-opening/closing device 1 (the detail will be described later). The pod 70 the locking mechanism of which is in the locked state is conveyed to the port 62 by the pod conveying device 56.

Prior to describing a lock-opening/closing mechanism of the lid-opening/closing device 1, the locking mechanism of a pod 70 will be described. FIG. 7 is a bottom view of a pod the lid portion of which is opened and closed by the lid-opening/closing device of FIG. 4, and FIGS. 8A and 8B include enlarged views of a locking mechanism of the pod of FIG. 7. As depicted in FIG. 7, in the pod 70, a plurality of locking mechanisms 74 are provided to the bottom portion of the container body 71. More specifically, the locking mechanisms 74 are provided to the bottom portion of the container body 71 so that a pair thereof are located at the bottom portion of the side wall on the front side of the container body 71 and another pair thereof are located at the bottom portion of the side wall on the rear side of the container body 71. The locking mechanisms 74 perform locking and unlocking the lid portion 72 with respect to the container body 71.

Figure 8A:
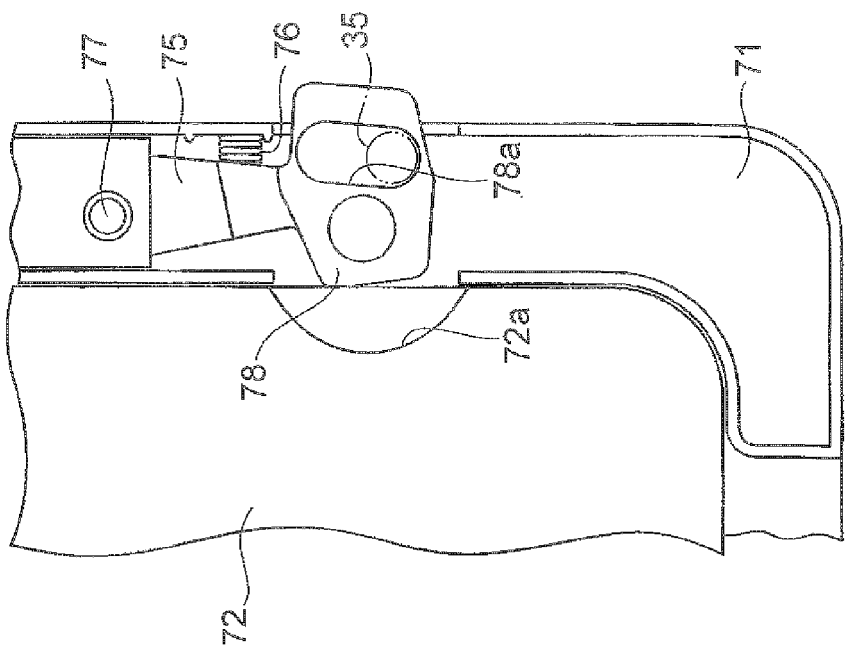
FIGS. 8A and 8B include enlarged views of a locking mechanism of the pod of FIG. 7.
Figure 8B:
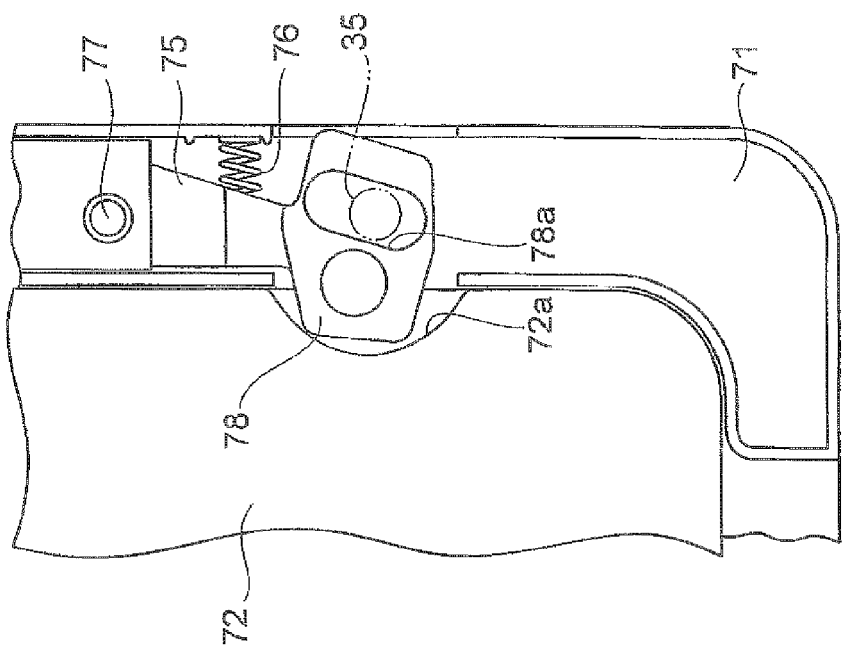

As depicted in FIGS. 8A and 8B, each locking mechanism 74 preferably includes an arm 75 and a biasing member 76 such as a compression spring, for example. The base-end portion of the arm 75 is pivotally supported by a shaft 77 in a rotatable manner on the bottom portion of the container body 71. The leading-end portion of the arm 75 is provided with an engaging portion 78. The engaging portion 78 engages with a notch 72a provided to the lid portion 72. The notch 72a is provided in plurality to the lid portion 72 so as to correspond to the engaging portion 78 of each locking mechanism 74, and is open to the side of the corresponding engaging portion 78 and to the lower side. The engaging portion 78 is provided with a recessed portion 78a that has an elongated hole shape and is open to the lower side. With this recessed portion 78a, each engaging pin (engaging portion) 35 of the lid-opening/closing device 1 described later engages.

The biasing member 76 is arranged between the container body 71 and the arm 75, and biases the arm 75 so that the engaging portion 78 engages with the notch 72a. Accordingly, when a pod 70 is conveyed to the lid-opening/closing device 1, the engaging portion 78 is engaged with the notch 72a, so that the locking mechanism 74 is put in the locked state (see FIG. 8A). In contrast, when the lid portion 72 is attached to and detached from the container body 71, the engaging portion 78 is disengaged from the notch 72a, so that the locking mechanism 74 is put in the unlocked state (see FIG. 8B). In this manner, the locking mechanism 74 locks and unlocks the lid portion 72 with respect to the container body 71. It should be noted that the above-described configuration of the locking mechanism 74 is merely one example, and another configuration may be used as long as it can lock and unlock the lid portion 72 with respect to container body 71 in a pod having a configuration according to the SEMI standard, for example.

Figure 9:
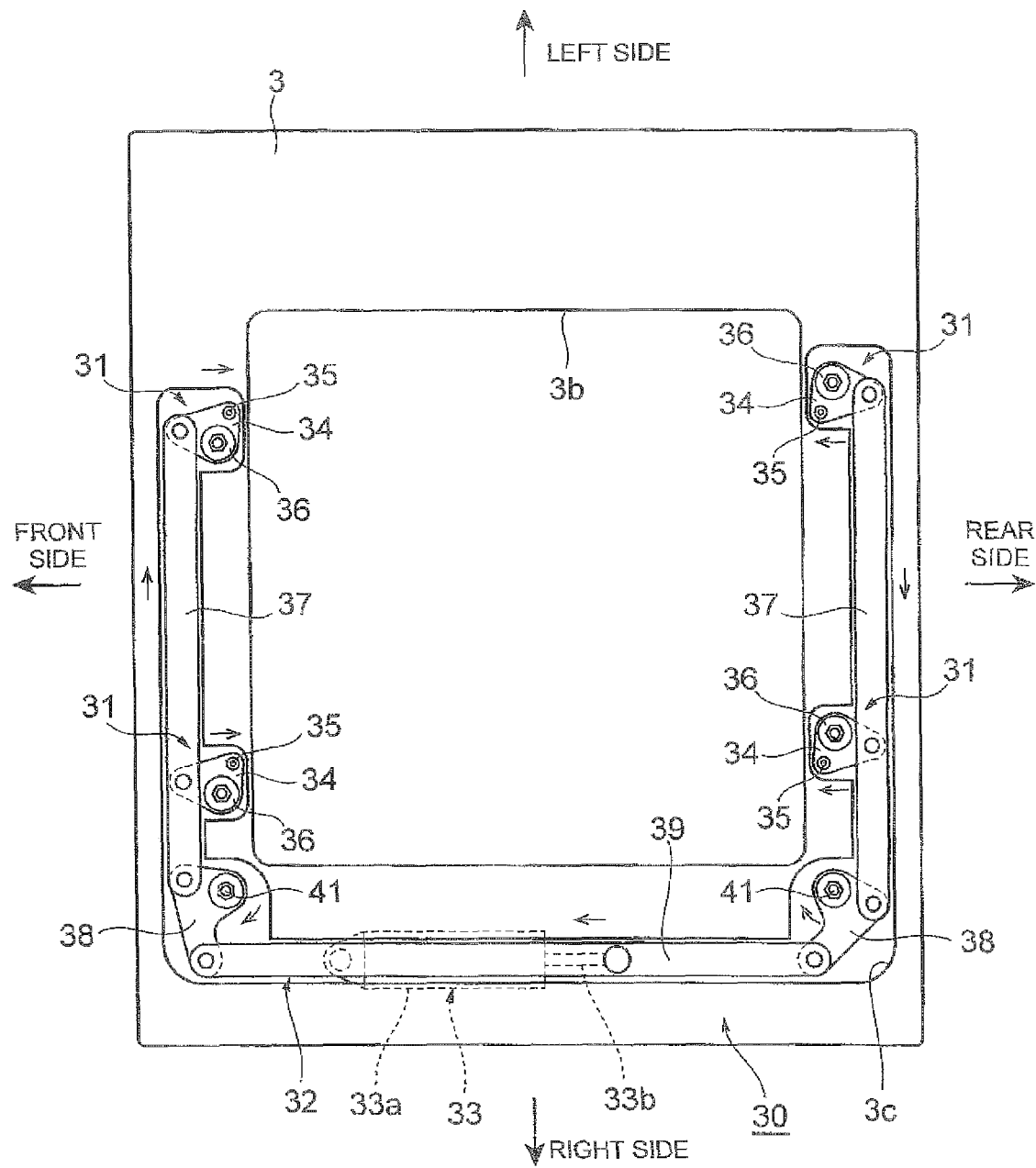
FIG. 9 is a sectional view of the lid-opening/closing device along line IX-IX of FIG. 4.

The following describes the lock-opening/closing mechanism of the lid-opening/closing device 1. FIG. 9 is a sectional view of the lid-opening/closing device along line IX-IX of FIG. 4. As depicted in FIG. 9, the lock-opening/closing mechanism 30 includes a plurality of moving units 31, a linkage unit 32, and an air cylinder (actuator) 33. The lock-opening/closing mechanism 30 is arranged in a recessed portion 3c that is provided to the upper wall 3. The recessed portion 3c extends in a circumference of the opening 3b so as to extend from front-side portion to rear-side portion via right-side portion.

When a pod 70 is placed on the placement surface 10 of the lid-opening/closing device 1, the moving units 31 are arranged to vertically face the respective locking mechanisms 74 of the pod 70. The moving units 31 each include plate-shaped first rotating members 34 and engaging pins 35 such as latch pins. The first rotating members 34 are rotatably supported by respective bearings 36 on the bottom surface of the recessed portion 3c. In each of the first rotating members 34 in a pair on the front side (i.e., positioned on the front side, or "one side" of the lid portion 72 when the pod 70 is placed on the placement surface 10), each engaging pin 35 is installed upright on the upper surface of the first rotating member 34 at a position on the left side of the bearing 36. In the first rotating members 34 on the rear side (i.e., located on the rear side, or "the other side" of the lid portion 72 when a pod 70 is placed on the placement surface 10), the engaging pins 35 are installed upright on the respective upper surfaces of a pair of the first rotating members 34 at positions on the right side of the bearings 36. The first rotating members 34 are kept from contacting with the device body 2 within movable ranges thereof (i.e., separated from the device body 2).

As depicted in FIG. 5, the respective engaging pins 35 protrude upward from the placement surface 10 through respective openings 3e each having an elongated hole shape and provided in a plurality to a top panel portion 3d. The top panel portion 3d covers the recessed portion 3c and defines the placement surface 10. Each opening 3e preferably having an elongated hole shape allows each engaging pin 35 to move between a position of the unlocking operation and a position of the locking operation. Accordingly, when a pod 70 is placed on the placement surface 10 of the lid-opening/closing device 1, each vertically facing one of the engaging pins 35 engages with the recessed portion 78a of each locking mechanism 74 of the pod 70.

As depicted in FIG. 9, the linkage unit 32 includes plate-shaped first connecting members 37, plate-shaped second rotating members 38, and a plate-shaped second connecting member 39. The first connecting member 37 on the front side preferably is a rod-shaped member extending in the right-to-left direction in the front-side portion of the recessed portion 3c, and is rotatably attached to the respective first rotating members 34 in a pair on the front side, at positions on the front side of the bearings 36. In this manner, the first connecting member 37 on the front side connects the pair of the first rotating members 34 on the front side to rotate the first rotating members 34. The first connecting member 37 on the rear side preferably is a rod-shaped member extending in a right-to-left direction in the rear-side portion of the recessed portion 3c, and is rotatably attached to the respective first rotating members 34 in a pair on the rear side, at positions on the rear side of the bearings 36. In this manner, the first connecting member 37 on the rear side connects the pair of the first rotating members 34 on the rear side to rotate the first rotating members 34. The second rotating members 38, the first connecting members 37, and the second connecting member 39 are kept from contacting with the device body 2 within the respective movable ranges.

The respective second rotating members 38 in a pair are rotatably supported by bearings 41 on the bottom surface of the recessed portion 3c. To the second rotating member 38 on the front side, the right-side end portion of the first connecting member 37 on the front side is rotatably attached at a position on the front side of the bearing 41. In this manner, the first connecting member 37 on the front side is connected to the second rotating member 38 on the front side. To the second rotating member 38 on the rear side, the right-side end portion of the first connecting member 37 on the rear side is rotatably attached at a position on the rear side of the bearing 41. In this manner, the first connecting member 37 on the rear side is connected to the second rotating member 38 on the rear side.

The second connecting member 39 preferably is a rod-shaped member extending in the front-to-rear direction in the right-side portion of the recessed portion 3c, and is rotatably attached to the respective second rotating members 38 in a pair at positions on the right side of the bearings 41. In this manner, the second connecting member 39 connects the pair of the second rotating members 38 to rotate the second rotating members 38.

The air cylinder 33 is an actuator that simultaneously drives the moving units 31 and the linkage unit 32 (i.e., imparts a driving force to the moving units 31 and the linkage unit 32). The air cylinder 33 is provided, one for the moving units 31 and the linkage unit 32, and is arranged below the second connecting member 39. The air cylinder 33 includes a cylinder portion 33a that is rotatably attached to the device body 2 and a rod portion 33b the base-end portion of which is inserted in the cylinder portion 33a. The leading-end portion of the rod portion 33b is rotatably attached to a middle portion of the second connecting member 39.

The following describes unlocking operation of the lock-opening/closing mechanism 30 to cause the locking mechanisms 74 of the pod 70 to perform unlocking. As depicted in FIG. 5, the lock-opening/closing mechanism 30 stands by with the engaging pins 35 positioned on the inner side (i.e., on the side of opening 3b) in the respective openings 3e each preferably having an elongated hole shape and provided to the top panel portion 3d. At this time, the moving units 31, the linkage unit 32, and the air cylinder 33 of the lock-opening/closing mechanism 30 are in a state depicted in FIG. 9. In this state, when a pod 70 is placed on the placement surface 10 of the lid-opening/closing device 1, with the recessed portion 78a of each locking mechanism 74 that is in the locked state in the pod 70 (see FIG. 8A), each vertically facing one of the engaging pins 35 engages.

Figure 10:
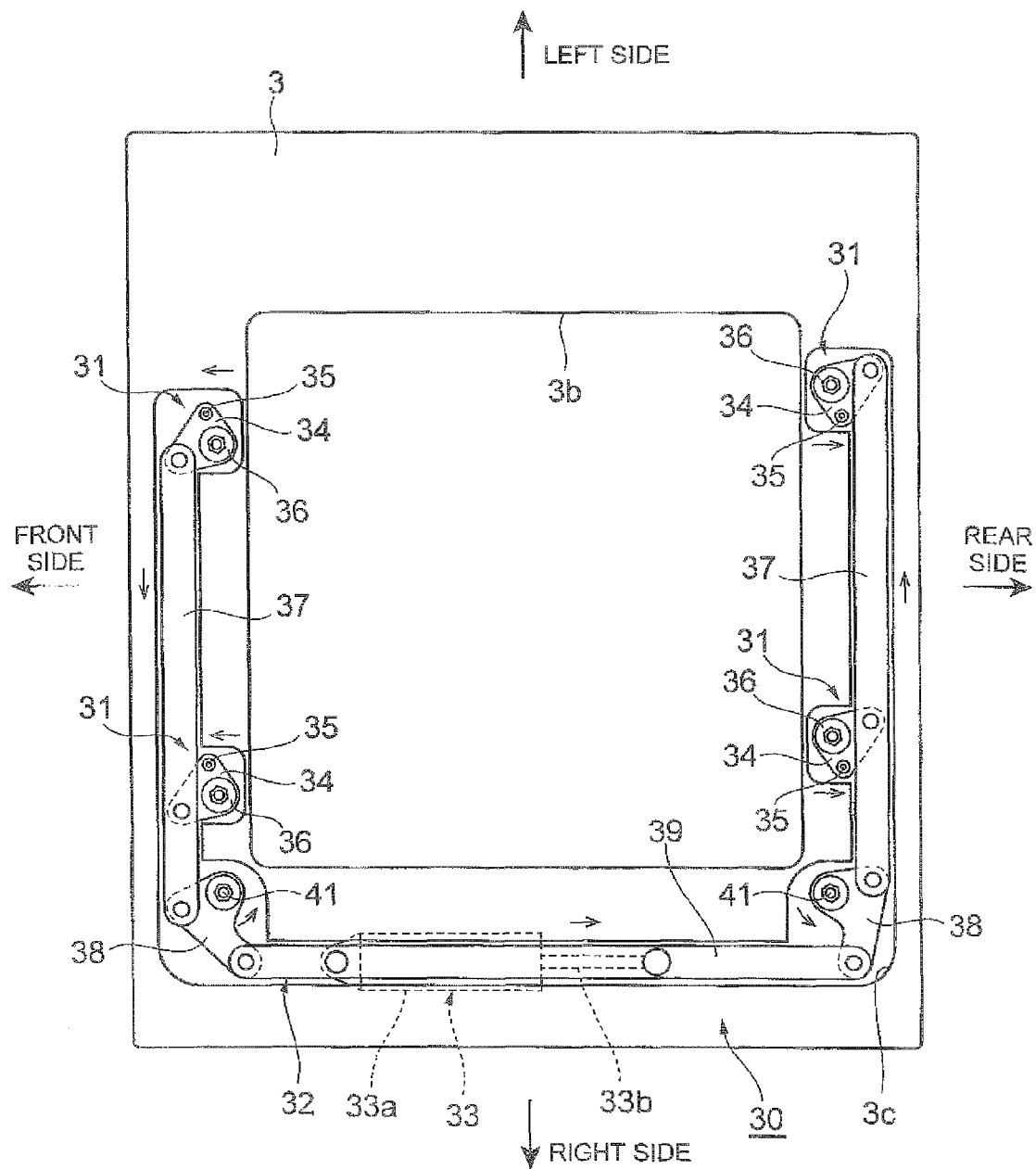
FIG. 10 is a sectional view of the lid-opening/closing device of FIG. 9 in another state.

Subsequently, as depicted in FIG. 10, in the lock-opening/closing mechanism 30, the rod portion 33b is slid to the rear side by charging or discharging gas into or from the cylinder portion 33a. This rotates the second rotating member 38 on the front side counterclockwise in plan view, thus moving the first connecting member 37 on the front side to the right side. Furthermore, the pair of the first rotating members 34 on the front side are rotated counterclockwise in plan view, such that the engaging pins 35 are moved to the front side. Meanwhile, the second rotating member 38 on the rear side is rotated counterclockwise in plan view, such that the first connecting member 37 on the rear side is moved to the left side. Furthermore, the pair of the first rotating members 34 on the rear side are rotated counterclockwise in plan view, such that the engaging pins 35 are moved to the rear side. In other words, in the respective openings 3e each preferably having an elongated hole shape and provided to the top panel portion 3d, the engaging pins 35 are positioned in the outer side (i.e., on the side opposite to the opening 3b). Accordingly, in each locking mechanism 74 of the pod 70, the engaging portion 78 is removed from the recessed portion 72a, such that each locking mechanism 74 is put into the unlocked state (see FIG. 8B), and the lid portion 72 is capable of being removed from the container body 71.

The following describes a locking operation of the lock-opening/closing mechanism 30 to cause the locking mechanisms 74 of the pod 70 to perform locking. The lock-opening/closing mechanism 30 stands by with the engaging pins 35 positioned on the outer side (i.e., on the side opposite to the opening 3b) in the respective openings 3e each preferably having an elongated hole shape and provided to the top panel portion 3d. At this time, the moving unit 31, the linkage unit 32, and the air cylinder 33 of the lock-opening/closing mechanism 30 are in a state depicted in FIG. 10. Each vertically facing one of the engaging pins 35 engages with the recessed portion 78a of each locking mechanism 74 that is in the unlocked state in the pod 70 (see FIG. 8B).

In this state, when the lid portion 72 is attached to the container body 71, as depicted in FIG. 9, in the lock-opening/closing mechanism 30, the rod portion 33b is slid to the front side by charging or discharging gas into or from the cylinder portion 33a. This rotates the second rotating member 38 on the front side clockwise in plan view, thereby moving the first connecting member 37 on the front side to the left side. Furthermore, the pair of the first rotating members 34 on the front side are rotated clockwise in plan view, such that the engaging pins 35 are moved to the rear side. Meanwhile, the second rotating member 38 on the rear side is rotated clockwise in plan view, such that the first connecting member 37 on the rear side is moved to the right side. Furthermore, the pair of the first rotating members 34 on the rear side are rotated clockwise in plan view, such that the engaging pins 35 are moved to the front side. In other words, as depicted in FIG. 5, in the respective openings 3e each preferably having an elongated hole shape and provided to the top panel portion 3d, the engaging pins 35 are positioned in the inner side (i.e., on the side of the opening 3b). Accordingly, in each locking mechanism 74 of the pod 70, the engaging portion 78 engages with the recessed portion 72a, such that each locking mechanism 74 is put into the locked state (see FIG. 8A).

As described above, in the lid-opening/closing device 1, the moving units 31 rotate the first rotating members 34 to move the engaging pins 35, thus performing the locking operation to cause the locking mechanisms 74 of the pod 70 to perform the locking and performing the unlocking operation to cause the locking mechanisms 74 of the pod 70 to perform the unlocking. When the locking mechanisms 74 of the pod 70 are caused to perform the locking, the linkage unit 32 causes the moving units 31 to perform the locking operation by moving the moving units 31 in conjunction with each other. When the locking mechanisms 74 of the pod 70 are caused to perform the unlocking, the linkage unit 32 causes the moving units 31 to perform the unlocking operation by moving the moving units 31 in conjunction with each other. Because the unlocking operation and the locking operation are performed by the moving units 31 simultaneously in this manner, the unlocking operation and the locking operation are quickly and accurately performed without occurrence of variations in the operations. In addition, because one air cylinder 33 simultaneously drives the moving units 31 and the linkage unit 32, the cost is significantly reduced. Furthermore, when the lock-opening/closing mechanism 30 is adjusted, it is only necessary to adjust a spot where the air cylinder 33 is connected with the second connecting member 39 that is a part to be driven, and thus the cost is significantly reduced in terms of easy maintenance. In view of this, the lid-opening/closing device 1 enables the lid portion 72 to be quickly and stably opened and closed with respect to the container body 71 with a configuration at a reduced cost.

Each of the moving units 31 preferably includes each first rotating member 34 that is rotatably supported by the device body 2 and moves each engaging pin 35, and the linkage unit 32 includes the first connecting members 37 each of which connects a pair of the first rotating members 34 to rotate the first rotating members 34. This enables the respective moving units 31 to be surely operated with a simple configuration of a link mechanism including the first rotating members 34 and the first connecting members 37.

The pair of the first rotating members 34 connected by each first connecting member 37 are preferably provided in a plurality of pairs so that the respective pairs are positioned on the front side and on the rear side of the lid portion 72 when the pod 70 is placed on the placement surface 10 of the device body 2. The linkage unit 32 further includes a pair of the second rotating members 38 that are rotatably supported by the device body 2 and to which the respective first connecting members 37 are connected, and the second connecting member 39 that connects the pair of the second rotating members 38 to rotate the second rotating members 38. With this configuration, even when the moving units 31 are provided in a plurality of pairs so that the respective pairs are positioned on the front side and the rear side of the lid portion 72, the respective moving units 31 is capable of being surely operated.

With the lid-opening/closing device 1, even if particles are generated in the lock-opening/closing mechanism 30, the surrounding clean environment is prevented from being contaminated. The following describes this reason. Specifically, in a linear-motion-type mechanism (such as a rod), because air is pushed away due to volume movement, generated particles easily diffuse. In contrast, in a rotation-type mechanism, because volume movement is generally smaller than that in the linear-motion-type mechanism (theoretically zero in a case of a perfectly circular plate) and a sliding area is easily identified (e.g., the bearings 36 being shaft-supporting portions in the present preferred embodiment), generated particles are effectively prevented from diffusing. In the lid-opening/closing device 1, at positions facing the openings 3e of the top panel portion 3d in the recessed portion 3c of the device body 2, the first rotating members 34 defining rotation-type mechanisms are positioned, so that the linear-motion-type mechanism is separated from the positions. Thus, with the lid-opening/closing device 1, generated particles are appropriately prevented from going out of the device body 2 through the openings 3e of the top panel portion 3d, such that the surrounding clean environment is prevented from being contaminated.

As an actuator that imparts a driving force to the moving units 31 and the linkage unit 32, the air cylinder 33 preferably is used, for example. This enables prevention of dust emission during the operations and also simplifies the mechanism, compared to the case using a rack-and-pinion mechanism, for example. Thus, the respective moving units 31 are surely operated while the inside of the device 1 and the atmosphere in the vicinity are maintained clean.

Because the rotating members 34 and 38 and the connecting members 37 and 39 are preferably plate-shaped members, the height of the lock-opening/closing mechanism 30 is significantly reduced, such that the lid-opening/closing device 1 is significantly downsized.

One preferred embodiment of the present invention has been described above, but the present invention is not limited to the above-described preferred embodiment. For example, the target for the lid-opening/closing device of the present invention is not limited to the pod 70 that stores therein a reticle R, and may be another storage container that stores therein another object to be stored. As an actuator that imparts a driving force to the moving units and the linkage unit, an actuator other than the air cylinder 33 may be used. As shapes and materials in all configurations described above, not limited to those described above, various shapes and materials can be used. The first and the second connecting members of various preferred embodiments of the present invention are not limited to the above-described rod-shaped members. Even if the first and the second connecting members are other types of connecting members such as wires, an operation mechanism similar to those described above can be implemented. The unlocking operation and the locking operation of the lock-opening/closing mechanism 30 can be performed even when the rotating directions of the rotating members 34 and 38 and the moving directions of the connecting members 37 and 39 are reversed from the above-described case.

One aspect of various preferred embodiments of the present invention enables a lid-opening/closing device to be provided that quickly and stably opens and closes a lid portion with respect to a container body with a configuration at a reduced cost.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A lid-opening/closing device for a storage container that includes a container body storing therein an object to be stored, a lid portion defining a bottom portion openable and closable with respect to the container body and on which the object to be stored is placed, and a locking mechanism that unlocks and locks the lid portion with respect to the container body, the lid-opening/closing device being configured to open and close the lid portion with respect to the container body and comprising:
   a device body on which the storage container is placed;
   a plurality of moving units each including an engaging portion that engages with a corresponding one of a plurality of recessed portions of the locking mechanism when the storage container is placed on the device body, and that unlocks and locks the locking mechanism by moving the engaging portion;
   a linkage unit that unlocks the locking mechanism by moving the moving units in conjunction with each other, and that locks the locking mechanism by moving the moving units in conjunction with each other; and
   an actuator that simultaneously drives the moving units and the linkage unit; wherein
   each of the moving units further includes a first rotating member that is rotatably supported by the device body and that moves the engaging portion;
   the linkage unit includes a first connecting member that connects at least a pair of the first rotating members to rotate the first rotating members;
   the pair of the first rotating members connected by the first connecting member are provided in a plurality of pairs so that respective pairs of the first rotating members are located on a first side and on a second side of the lid portion when the storage container is placed on the device body;
   the linkage unit further includes a pair of second rotating members that are rotatably supported by the device body and to which the respective first connecting members are connected, and a second connecting member that connects the pair of the second rotating members to rotate the second rotating members; and
   the moving units move the engaging portions such that the locking mechanism switches between a locked position and an unlocked position while the engaging portions are engaged in the recessed portion of the locking mechanism.

2. The lid-opening/closing device according to claim 1, wherein
   the actuator is an air cylinder including a cylinder portion attached to the device body and a rod portion including a base end inserted into the cylinder portion and a leading end attached to the second connecting member; and
   the rod portion slides by charging or discharging gas into or from the cylinder portion.

3. The lid-opening/closing device according to claim 1, wherein the device body includes:
   a recessed portion in which the moving units, the linkage unit, and the actuator are arranged; and
   a top panel portion that covers the recessed portion and defines a placement surface on which the storage container is placed; wherein
   the engaging portion is an engaging pin that is installed upright on each of the first rotating members; and
   the top panel portion is provided with an opening that has an elongated hole shape and through which the engaging pin protrudes from the placement surface to be able to move between the unlocked position and the locked position of the locking mechanism.

4. A lid-opening/closing device for a storage container provided with a container body storing therein an object to be stored, a lid portion defining a bottom portion openable and closable with respect to the container body and on which the object to be stored is placed, and a locking mechanism configured to perform unlocking and locking of the lid portion with respect to the container body, the lid-opening/closing device being configured to open and close the lid portion with respect to the container body and comprising:
   a device body on which the storage container is placed;
   a plurality of moving units each including an engaging portion configured to engage with the locking mechanism when the storage container is placed on the device body, and configured to perform an unlocking operation to cause the locking mechanism to perform the unlocking and a locking operation to cause the locking mechanism to perform the locking by moving the engaging portion;
   a linkage unit configured to cause the moving units to perform the unlocking operation by moving the moving units in conjunction with each other when causing the locking mechanism to perform the unlocking, and to cause the moving units to perform the locking operation by moving the moving units in conjunction with each other when causing the locking mechanism to perform the locking; and
   an actuator provided for the moving units and the linkage unit and configured to simultaneously drive the moving units and the linkage unit; wherein
   each of the moving units further includes a first rotating member that is rotatably supported by the device body and is configured to move the engaging portion;
   the linkage unit includes a first connecting member configured to connect at least a pair of the first rotating members to rotate the first rotating members;
   the device body includes:
      a recessed portion in which the moving units, the linkage unit, and the actuator are arranged; and
      a top panel portion that covers the recessed portion and defines a placement surface on which the storage container is placed; wherein
   the engaging portion is an engaging pin that is installed upright on each of the first rotating members; and
   the top panel portion is provided with an opening that has an elongated hole shape and through which the engaging pin protrudes from the placement surface to be able to move between a position of the unlocking operation and a position of the locking operation;
   the pair of the first rotating members connected by the first connecting member are provided in a plurality of pairs so that respective pairs of the first rotating members are located on a first side and on a second side of the lid portion when the storage container is placed on the device body;
   the linkage unit further includes a pair of second rotating members that are rotatably supported by the device body and to which the respective first connecting members are connected, and a second connecting member that connects the pair of the second rotating members to rotate the second rotating members; and the moving units move the engaging portions such that the locking mechanism switches between a locked position and an unlocked position while the engaging portions are engaged in the recessed portion of the locking mechanism.

\* \* \* \* \*